United States Patent
Lee et al.

(10) Patent No.: US 10,775,699 B2
(45) Date of Patent: Sep. 15, 2020

(54) NEGATIVE PHOTORESIST COMPOSITION FOR KRF LASER, HAVING HIGH RESOLUTION AND HIGH ASPECT RATIO

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Su Jin Lee, Daegu (KR); Young Cheol Choi, Gumi-si (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 182 days.

(21) Appl. No.: 16/086,485

(22) PCT Filed: Mar. 22, 2017

(86) PCT No.: PCT/KR2017/003043
§ 371 (c)(1),
(2) Date: Sep. 19, 2018

(87) PCT Pub. No.: WO2017/164633
PCT Pub. Date: Sep. 28, 2017

(65) Prior Publication Data
US 2019/0101827 A1    Apr. 4, 2019

(30) Foreign Application Priority Data
Mar. 22, 2016 (KR) .................. 10-2016-0033733

(51) Int. Cl.
*G03F 7/038* (2006.01)
*G03F 7/004* (2006.01)
*G03F 7/40* (2006.01)

(52) U.S. Cl.
CPC ............. *G03F 7/038* (2013.01); *G03F 7/004* (2013.01); *G03F 7/0045* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 6,110,641 A | 8/2000 | Trefonas, III et al. | |
| 6,569,596 B1* | 5/2003 | Uetani | G03F 7/0045 430/270.1 |
| 2008/0254634 A1 | 10/2008 | Park et al. | |
| 2011/0274853 A1* | 11/2011 | Park | G03F 7/0045 427/595 |
| 2011/0316116 A1* | 12/2011 | Sato | G03F 7/027 257/506 |
| 2014/0349222 A1* | 11/2014 | Shibui | C08G 8/22 430/18 |
| 2015/0064622 A1* | 3/2015 | Yoshida | C08F 216/10 430/270.1 |
| 2015/0118620 A1* | 4/2015 | Anryu | C07C 381/12 430/281.1 |

FOREIGN PATENT DOCUMENTS

| | | | | |
|---|---|---|---|---|
| EP | 0588092 A2 * | 3/1994 | ........... | G03F 7/0045 |
| JP | 06-059444 A | 3/1994 | | |
| JP | 2000-206681 A | 7/2000 | | |
| JP | 2006-317584 A | 11/2006 | | |
| JP | 2013-527940 A | 7/2013 | | |
| JP | 2015-132676 A | 7/2015 | | |
| KR | 10-0266276 B1 | 9/2000 | | |
| KR | 2011-0022227 A | 3/2011 | | |
| KR | 10-2011-0122642 A | 11/2011 | | |
| KR | 10-2013-0077466 A | 7/2013 | | |
| KR | 10-2015-0026996 A | 3/2015 | | |
| KR | 10-2015-0047433 A | 5/2015 | | |
| KR | 10-2015-0067236 A | 6/2015 | | |
| KR | 10-1598826 B1 | 3/2016 | | |

* cited by examiner

*Primary Examiner* — Cynthia Hamilton
(74) *Attorney, Agent, or Firm* — Novick, Kim & Lee, PLLC; Jae Youn Kim

(57) ABSTRACT

Disclosed is a negative photoresist composition for a KrF laser, having high resolution and a high aspect ratio and, more particularly, a negative photoresist composition for a KrF laser, which includes a specific additive in order to improve the properties of a conventional negative photoresist, whereby the negative photoresist composition can prevent fine-pattern collapse even using a short-wavelength exposure light source, compared to conventional negative photoresists, and can also exhibit high resolution and a high aspect ratio and is thus suitable for use in semiconductor processing.

4 Claims, No Drawings

NEGATIVE PHOTORESIST COMPOSITION FOR KRF LASER, HAVING HIGH RESOLUTION AND HIGH ASPECT RATIO

TECHNICAL FIELD

The present invention relates to a negative photoresist composition for a KrF laser, having high resolution and a high aspect ratio.

BACKGROUND ART

With the recent demand to reduce the size and increase the degree of integration of semiconductor devices through the development of semiconductor manufacturing technology, techniques for forming ultrafine patterns having line widths corresponding to tens of nm or less are required. Advances in techniques for forming ultrafine patterns have been made by the use of light sources having smaller wavelengths and through the development of processing technology and photoresists suitable for such light sources.

A photoresist is used for photolithography for forming a variety of patterns. The term "photoresist" refers to a photosensitive resin, the solubility of which varies in a developing solution due to the action of light, to thus obtain an image corresponding to the exposure pattern.

The formation of a photoresist pattern includes negative tone development (NTD) using a negative tone developing solution and positive tone development (PTD) using a positive tone developing solution.

The process of forming a pattern through NTD includes selectively dissolving and removing an unexposed region using a negative tone developing solution, and the process of forming a pattern through PTD includes selectively dissolving and removing an exposed region using a positive tone developing solution.

When compared to pattern formation using PTD, pattern formation using NTD enables the formation of a reverse-phase pattern in a contact-hole pattern or a trench pattern, which is considered to be difficult to form due to insufficient exposure, thereby making it easy to consistently form a pattern. Furthermore, an organic solvent is used as the developing solution for removing the unexposed portion, thereby more effectively forming a photoresist pattern.

Meanwhile, a typical photolithography process using a photoresist composition includes coating a wafer with a photoresist, performing soft baking for heating the coated photoresist to evaporate the solvent, forming an image by means of a light source passed through a photomask, forming a pattern through a difference in solubility between an exposed portion and an unexposed portion using a developing solution, and completing a circuit through etching.

The photoresist composition is composed of a photosensitive agent (a photoacid generator) for generating an acid through excimer laser irradiation, a basic resin and other additives. The basic resin, configured such that a phenol structure contains a hydroxyl group, typically includes a polystyrene polymer, and any photosensitive agent may be used, so long as it is able to generate an acid ($H^+$) at a specific wavelength, and main examples thereof may include sulfonium-, sulfonyl diazo-, benzo sulfonyl-, iodine-, chlorine-, and carboxylic acid-based organic and inorganic acids.

However, a negative photoresist obtained using the above composition is problematic in that the photosensitive agent therein is unable to generate a sufficient amount of acid ($H^+$), making it impossible to form a desired shape, and also in that a profile deteriorates upon the formation of a finer pattern.

Also, a light source mainly used for the above process has a wavelength range of 365 nm to 193 nm, examples of which include an I-ray, a KrF excimer laser, and an ArF excimer laser. As is known in the art, the shorter the wavelength, the finer the pattern.

In particular, thorough research into a KrF laser (243 nm) photoresist for photo microprocessing is ongoing despite the development of an ArF laser (193 nm) system. This is because the development of next-generation ArF photoresists is still unsatisfactory and also because the use of a KrF photoresist may greatly reduce the cost for mass production of semiconductors. Accordingly, the performance of a KrF photoresist has to be improved in response to such technical development, and, for example, the thickness of the photoresist is required to decrease with an increase in the degree of integration. Hence, the development of a photoresist in which dry etching resistance is further increased is urgently required. In addition thereto, there are requirements for high resolution, a wide DOF (Depth Of Focus) margin, defect-free thin film formation, adhesion to a substrate, high contrast, fast sensitivity and chemical stability.

Conventional techniques pertaining to the negative photoresist for a KrF laser include Korean Patent No. 10-0266276 [Negative photoresist composition], Korean Patent Application Publication No. 10-2015-0067236 [Negative photosensitive resin composition], Korean Patent Application Publication No. 10-2015-0047433 [Salt and photoresist composition including same], and Korean Patent Application Publication No. 10-2015-0026996 [Compound, resin, photoresist composition, and method of forming photoresist pattern].

As disclosed in the conventional patents, a photoresist for KrF is mainly composed of polyhydroxystyrene and polystyrene polymers having good transmittance at a wavelength of 248 nm in order to increase resolution and sensitivity.

However, the photoresist composed of polyhydroxystyrene and polystyrene polymers is problematic because the formed pattern is comparatively loose and thus a fine pattern having high aspect ratio may easily collapse, making it difficult to form a pattern having high resolution and a high aspect ratio.

DISCLOSURE

Technical Problem

Accordingly, the present invention is intended to provide a negative photoresist composition for a KrF laser, which is able to form a pattern having high resolution and a high aspect ratio, compared to conventional negative photoresists for KrF.

Technical Solution

Therefore, the present invention provides a negative photoresist composition for a KrF laser, including a novolac resin having a weight average molecular weight of 3,000 to 50,000 represented by Chemical Formula 1 below.

[Chemical Formula 1]

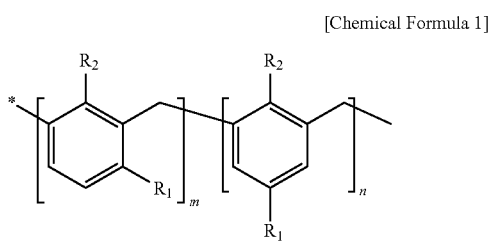

In the above Chemical Formula, $R_1$ is a methyl group, R2 is a hydroxyl group (—OH), m is 1 to 9, and n is 1 to 9.

In a preferred embodiment of the present invention, the composition includes, based on the total weight of the composition, 5 to 60 wt % of a polymer resin, 0.1 to 5 wt % of the novolac resin represented by Chemical Formula 1, 1 to 10 wt % of a crosslinking agent, 0.1 to 10 wt % of a photoacid generator, 0.01 to 5 wt % of an acid diffusion inhibitor, and the remainder of a solvent.

In a preferred embodiment of the present invention, the polymer resin is at least one selected from the group consisting of a phenol polymer resin and a cresol polymer resin, each of which has a hydroxyl group.

In a preferred embodiment of the present invention, the phenol polymer resin is obtained from at least one monomer selected from the group consisting of 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin is obtained from at least one monomer selected from the group consisting of o-cresol, p-cresol, m-cresol, epoxy o-cresol, epoxy p-cresol, and epoxy m-cresol.

In a preferred embodiment of the present invention, the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxy methyl urea, tetramethoxy ethyl urea, and tetramethoxyethyl-2,4-diamino-1,3,5-triazine.

In a preferred embodiment of the present invention, the photoacid generator includes at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

In a preferred embodiment of the present invention, the acid diffusion inhibitor includes at least one selected from the group consisting of dimethylamine, diethylamine, trimethylamine, triethylamine, tributylamine, dimethanolamine, diethanolamine, trimethanolamine, triethanolamine, and tributanolamine.

Advantageous Effects

According to the present invention, a negative photoresist composition for a KrF laser has high resolution, a high aspect ratio and a good profile, and can enhance the strength of a formed pattern and can prevent fine-pattern collapse compared to conventional negative photoresists, and is thus suitable for use in semiconductor processing.

BEST MODE

Unless otherwise defined, all the technical and scientific terms used herein have the same meanings as those typically understood by those skilled in the art to which the present invention belongs. Generally, the nomenclature used herein is well known in the art and is typical.

As used herein, when any part "includes" any element, this does not mean that other elements are excluded, and such other elements may be further included unless otherwise specifically mentioned.

As used herein, the term "photoresist" refers to a mixture comprising a polymer and a photosensitive agent, the chemical properties of which change upon radiation of light thereto, thus altering the solubility thereof in a specific solvent when exposed to light of any wavelength, and thus an undissolved portion is left behind to thus form a pattern after the duration of a certain dissolution time due to the difference in dissolution rate between an exposed portion and an unexposed portion for the solvent.

As used herein, the term "photolithography" means that, when a mask having a semiconductor circuit design is disposed between a light source and a photoresist layer applied on a silicon wafer and the light source is turned on, the circuit of the mask is transferred onto the photoresist using the properties of the photoresist.

As used herein, the term "KrF laser" refers to a krypton fluoride (KrF) laser having a wavelength of 248 nm.

As used herein, the term "aspect ratio" refers to a ratio of width to length. In the formation of patterns of various shapes using the photoresist, when a pattern height (length) increases, increasing a pattern thickness (width) is a general tendency in order to prevent pattern collapse. Since a high wall may be formed even at a narrow thickness due to enhancement in the strength of the photoresist, a high aspect ratio becomes favorable. The aspect ratio is regarded as an important physical property of the photoresist. Specifically, when a pattern is formed using a material of consistent strength, the height of a wall thereof may increase with an increase in the width of the wall.

An embodiment of the present invention pertains to a negative photoresist composition for a KrF laser, including a novolac resin having a weight average molecular weight of 3,000 to 50,000 represented by Chemical Formula 1 below.

[Chemical Formula 1]

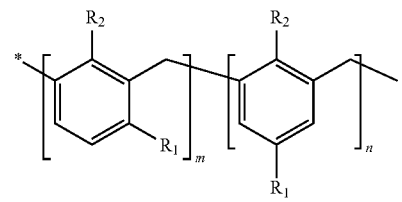

In the above Chemical Formula, $R_1$ is a methyl group, $R_2$ is a hydroxyl group (—OH), m is 1 to 9, and n is 1 to 9.

According to the present invention, the negative photoresist composition for a KrF laser may include, based on the total weight of the composition, 5 to 60 wt % of a polymer resin, 0.1 to 5 wt % of the novolac resin represented by Chemical Formula 1, 1 to 10 wt % of a crosslinking agent, 0.1 to 10 wt % of a photoacid generator, 0.01 to 5 wt % of an acid diffusion inhibitor, and the remainder of a solvent.

Here, the novolac resin represented by Chemical Formula 1 is preferably contained in an amount of 0.1 to 5 wt % based on the total weight of the composition. If the amount of the novolac resin represented by Chemical Formula 1 is less than 0.1 wt %, there is no improvement in resolution due to the insignificant amount thereof, making it difficult to form a fine pattern, and also there is no improvement in aspect ratio. On the other hand, if the amount thereof exceeds 5 wt %, problems such as low resolution and pattern footing may occur.

The polymer resin may be at least one selected from the group consisting of a phenol polymer resin and a cresol polymer resin, each of which has a hydroxyl group.

More specifically, the phenol polymer resin may be obtained from at least one monomer selected from the group consisting of 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin may be obtained from at least one monomer selected from the group consisting of o-cresol, p-cresol, m-cresol, epoxy o-cresol, epoxy p-cresol, and epoxy m-cresol.

The polymer resin is preferably contained in an amount of 5 to 60 wt % based on the total weight of the composition. If the amount of the polymer resin is less than 5 wt %, high exposure energy is required upon patterning and development. On the other hand, if the amount thereof exceeds 60 wt %, it is difficult to form a uniform pattern, undesirably generating a residue.

The crosslinking agent may include at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxy methyl urea, tetramethoxy ethyl urea, and tetramethoxyethyl-2,4-diamino-1,3,5-triazine.

The crosslinking agent is preferably contained in an amount of 1 to 10 wt % based on the total weight of the composition. If the amount of the crosslinking agent is less than 1 wt %, pattern formation may become impossible owing to the low ratio of remaining film. On the other hand, if the amount thereof exceeds 10 wt %, defects may take place owing to bridging between patterns due to excessive crosslinking.

The photoacid generator may include at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

The photoacid generator is preferably contained in an amount of 0.1 to 10 wt % based on the total weight of the composition. If the amount of the photoacid generator is less than 0.1 wt %, pattern formation may become impossible due to the lack of crosslinking density. On the other hand, if the amount thereof exceeds 10 wt %, pattern defects may occur, in which the wall or edge of the pattern may deteriorate (LWR.LER) owing to excessive acid generation.

The acid diffusion inhibitor may include at least one selected from the group consisting of dimethylamine, diethylamine, trimethylamine, triethylamine, tributylamine, dimethanolamine, diethanolamine, trimethanolamine, triethanolamine, and tributanolamine.

The acid diffusion inhibitor is preferably contained in an amount of 0.01 to 5 wt % based on the total weight of the composition. If the amount of the acid diffusion inhibitor is less than 0.01 wt %, pattern defects may occur in which the wall or edge of the pattern may deteriorate (LWR.LER) owing to excessive acid generation. On the other hand, if the amount thereof exceeds 5 wt %, pattern formation may become impossible.

Meanwhile, the negative photoresist composition for a KrF laser according to the present invention may be used at a thickness of 1,000 Å to 100,000 Å depending on the type and amount of the solvent that is used, and may be dissolved in an amount of 10 to 90 wt % relative to the weight of the solvent, and may then be used.

Examples of the solvent may include ethyleneglycol monomethylether, ethyleneglycol monoethylether, methylcellosolve acetate, ethylcellosolve acetate, diethyleneglycol monomethylether, diethyleneglycol monoethylether, propyleneglycol methyl ether acetate, propyleneglycol propyl ether acetate, diethyleneglycol dimethylether, ethyl lactate, toluene, xylene, methylethylketone, cyclohexanone, 2-heptanone, 3-heptanone, and 4-heptanone, which may be used alone or in combination.

As described above, the negative photoresist composition for a KrF laser according to the present invention includes the novolac resin represented by Chemical Formula 1 in an optimal amount and is thus suitable for use in semiconductor processing, thereby exhibiting high resolution and a high aspect ratio to thus realize fine pattern formation and a good profile even using a short-wavelength exposure light source.

MODE FOR INVENTION

A better understanding of the present invention may be obtained through the following examples, which are set forth to illustrate, but are not to be construed as limiting the scope of the present invention, as is apparent to those skilled in the art.

Example 1

945.1 g of a negative photoresist composition for a KrF excimer laser was prepared by mixing 80 g of a phenol polymer resin having a weight average molecular weight of 5,000 serving as a basic resin, 0.5 g (0.05 wt %) of a novolac resin represented by Chemical Formula 1 below (m:5, n:5)

having a weight average molecular weight of 11,000, 4 g of triphenylsulfonium nonaflate serving as a photoacid generator, 10 g of tetramethoxymethyl glycoluril serving as a crosslinking agent, 0.6 g of tributylamine serving as an acid diffusion inhibitor, and a solvent mixture comprising 150 g of ethyl lactate and 700 g of propyleneglycol methyl ether acetate. The prepared composition was filtered using a 0.1 µm Teflon syringe filter, applied on a silicon wafer using a spin coater, and soft-baked at 100° C. for 90 sec, after which a desired thickness of 500 nm was confirmed. An exposure process was performed under a light source at 248 nm. After completion of the exposure process, a baking process at 110° C. for 90 sec and a development process using 2.38% tetramethylammonium hydroxide were carried out to thus form a pattern. Consequently, a pattern having a sensitivity of 43 mJ/cm$^2$, a line/space resolution of 0.18 µm, a minimum line width of 140.5 nm, and an aspect ratio of 1:3.57 was obtained.

[Chemical Formula 1]

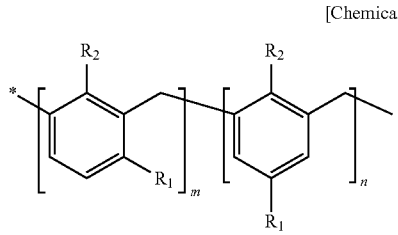

Example 2

The same procedures as in Example 1 were performed, with the exception that 945.6 g of a negative photoresist composition for a KrF excimer laser was prepared using 1 g (0.10 wt %) of the novolac resin represented by Chemical Formula 1 (m:5, n:5). Consequently, a pattern having a sensitivity of 45 mJ/cm$^2$, a line/space resolution of 0.15 µm, a minimum line width of 98.1 nm, and an aspect ratio of 1:5.09 was obtained.

Example 3

The same procedures as in Example 1 were performed, with the exception that 989.6 g of a negative photoresist composition for a KrF excimer laser was prepared using 45 g (4.54 wt %) of the novolac resin represented by Chemical Formula 1 (m:5, n:5). Consequently, a pattern having a sensitivity of 48 mJ/cm$^2$, a line/space resolution of 0.15 µm, a minimum line width of 100.3 nm, and an aspect ratio of 1:4.98 was obtained.

Example 4

The same procedures as in Example 1 were performed, with the exception that 1004.6 g of a negative photoresist composition for a KrF excimer laser was prepared using 60 g (5.97 wt %) of the novolac resin represented by Chemical Formula 1 (m:5, n:5). Consequently, a pattern having a sensitivity of 50 mJ/cm$^2$, a line/space resolution of 0.15 µm, a minimum line width of 99.7 nm, and an aspect ratio of 1:5.01 was obtained.

Comparative Example 1

The same procedures as in Example 1 were performed, with the exception that the novolac resin represented by Chemical Formula 1 was not added. Consequently, a pattern having a sensitivity of 42 mJ/cm$^2$, a line/space resolution of 0.18 µm, a minimum line width of 149.8 nm, and an aspect ratio of 1:3.34 was obtained.

Measurement of Properties

The properties of the negative photoresist compositions for the KrF laser prepared in Examples 1 to 4 and Comparative Example 1 were measured.

The resolution was determined by measuring an L/S (Line, Space) minimum line width (resolution) using a critical-dimension-scanning electron microscope (CD-SEM) for observing a pattern line width (critical dimension). Also, the energy able to determine the minimum line width (resolution) was measured and taken as the sensitivity.

The results are shown in Table 1 below.

TABLE 1

| | Sensitivity (mJ/cm$^2$) | Resolution (µm) | Minimum pattern size (nm) | Aspect ratio |
|---|---|---|---|---|
| Example 1 | 43 | 0.18 | 140.5 | 1:3.57 |
| Example 2 | 45 | 0.15 | 98.1 | 1:5.09 |
| Example 3 | 48 | 0.15 | 100.3 | 1:4.98 |
| Example 4 | 50 | 0.15 | 99.7 | 1:5.01 |
| Comparative Example 1 | 42 | 0.18 | 149.8 | 1:3.34 |

As is apparent from Table 1, Examples 1 to 4 were improved in aspect ratio and minimum line width size compared to Comparative Example 1, and the resolution was similar or improved depending on the amount of the novolac resin represented by Chemical Formula 1.

Among Examples 1 to 4, Examples 2 and 3 exhibited resolution that was similar or improved compared to Examples 1 and 4, and the aspect ratio and the minimum line width size were also improved. In Example 1, the amount of the novolac resin represented by Chemical Formula 1 was insignificant, and thus there was no improvement in resolution, making it difficult to form a fine pattern and exhibiting no improvement in aspect ratio. In Example 4 using an excess of the novolac resin represented by Chemical Formula 1, the resolution, minimum line width size and aspect ratio were improved, but the energy margin was reduced, and slight pattern footing was confirmed.

In conclusion, when the novolac resin represented by Chemical Formula 1 is contained in an optimal amount, a negative photoresist composition for a KrF laser, capable of increasing pattern strength and hardness, preventing fine-pattern collapse and realizing high resolution and a high aspect ratio, can be obtained.

All simple modifications or variations of the present invention may be easily performed by those skilled in the art, and may be incorporated in the scope of the present invention.

The invention claimed is:

1. A negative photoresist composition for a KrF laser, comprising:
   (a) 5 to 60 wt % of a phenol polymer resin;
   (b) 0.1 to 5 wt % of a novolac resin having a weight average molecular weight of 3,000 to 50,000 represented by Chemical Formula 1 below;
   (c) 1 to 10 wt % of a crosslinking agent;
   (d) 0.1 to 10 wt % of a photoacid generator;
   (e) 0.01 to 5 wt % of an acid diffusion inhibitor; and
   (f) a remainder of a solvent,
   wherein the phenol polymer resin is obtained from at least one monomer selected from the group consisting of 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde:

[Chemical Formula 1]

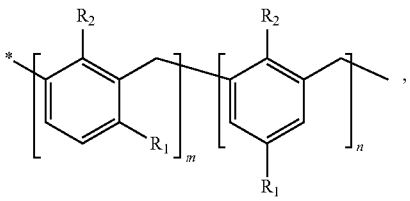

wherein $R_1$ is a methyl group,
$R_2$ is a hydroxyl group (—OH),
m is 1 to 9, and
n is 1 to 9.

2. The negative photoresist composition of claim 1, wherein the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxy methyl urea, tetramethoxy ethyl urea, and tetramethoxyethyl-2,4-diamino-1,3,5-triazine.

3. The negative photoresist composition of claim 1, wherein the photoacid generator includes at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

4. The negative photoresist composition of claim 1, wherein the acid diffusion inhibitor includes at least one selected from the group consisting of dimethylamine, diethylamine, trimethylamine, triethylamine, tributylamine, dimethanolamine, diethanolamine, trimethanolamine, triethanolamine, and tributanolamine.

* * * * *